(12) United States Patent
Bai

(10) Patent No.: US 10,707,451 B2
(45) Date of Patent: Jul. 7, 2020

(54) OLED SUBSTRATE AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Yamei Bai, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 4 days.

(21) Appl. No.: 16/099,224

(22) PCT Filed: Sep. 26, 2018

(86) PCT No.: PCT/CN2018/107699
§ 371 (c)(1),
(2) Date: Nov. 6, 2018

(87) PCT Pub. No.: WO2020/019481
PCT Pub. Date: Jan. 30, 2020

(65) Prior Publication Data
US 2020/0035956 A1    Jan. 30, 2020

(30) Foreign Application Priority Data

Jul. 26, 2018    (CN) .......................... 2018 1 0836758

(51) Int. Cl.
*H01L 21/00*        (2006.01)
*H01L 51/40*        (2006.01)
(Continued)

(52) U.S. Cl.
CPC .......... *H01L 51/56* (2013.01); *H01L 27/3211* (2013.01); *H01L 27/3246* (2013.01);
(Continued)

(58) Field of Classification Search
CPC ... H01L 51/56; H01L 51/0005; H01L 51/003; H01L 51/0096; H01L 27/3211; H01L 27/3246
See application file for complete search history.

(56) References Cited

U.S. PATENT DOCUMENTS 8,193,018 B2 *   6/2012   Cok ................... H01L 27/3211
                                              257/390
2009/0179210 A1 *  7/2009   Cok ................... H01L 51/0014
                                              257/98
(Continued)

FOREIGN PATENT DOCUMENTS

CN      102169959 A    8/2011
CN      103887319 A    6/2014

*Primary Examiner* — Alonzo Chambliss
(74) *Attorney, Agent, or Firm* — Mark M. Friedman

(57) ABSTRACT

The present disclosure provides an organic light-emitting diode (OLED) substrate and a method for manufacturing same. The method includes providing a substrate that includes a non-pixel area, a first pixel area, a second pixel area, and a third pixel area; forming a first sacrificial layer in the first pixel area and the second pixel area, forming a third light-emitting material layer on the substrate, and removing the first sacrificial layer, so as to form a third pixel area organic layer; and using the same steps to form a second pixel area organic layer and a first pixel area organic layer.

16 Claims, 4 Drawing Sheets

(51) Int. Cl.
*H01L 29/08* (2006.01)
*H01L 33/00* (2010.01)
*H01L 51/56* (2006.01)
*H01L 51/00* (2006.01)
*H01L 27/32* (2006.01)

(52) U.S. Cl.
CPC ........ *H01L 51/003* (2013.01); *H01L 51/0005* (2013.01); *H01L 51/0096* (2013.01)

(56) References Cited

U.S. PATENT DOCUMENTS

| | | |
|---|---|---|
| 2011/0171584 A1 | 7/2011 | Suh et al. |
| 2015/0236308 A1 | 8/2015 | Kim et al. |
| 2016/0133676 A1* | 5/2016 | Kim .................... H01L 27/3246 257/40 |

* cited by examiner

OLED SUBSTRATE AND METHOD FOR MANUFACTURING SAME

FIELD OF INVENTION

The present disclosure relates to the field of display technology, and more particularly to an organic light-emitting diode (OLED) substrate and a method for manufacturing same.

BACKGROUND

Organic film formation is an essential step in manufacturing OLED displays. Generally, organic films of OLED devices have to have a uniform and thin thickness. Therefore, it is challenging for any person skilled in the art to form an organic film that is thin and, in the meanwhile, has a uniform thickness.

One organic film formation technique is to use a fine metal mask (FMM) to form organic films by vacuum evaporation. Such technique using FMM includes step of heating an organic material under vacuum, so as to have organic material be evaporated and deposited on substrate on which a mask is disposed, such that a sub-pixel film is formed in corresponding areas on the substrate. Although the FMM technique has been widely used, alignment between mask and substrate is still not precise because mask itself will deform due to gravity and thermal expansion thereof, and thus organic film cannot be accurately and efficiently formed.

SUMMARY OF DISCLOSURE

The present disclosure provides an organic light-emitting diode (OLED) substrate and a method for manufacturing same to solve the problems encountered by the prior art, where alignment between mask and substrate is not precise because mask itself will deform due to gravity and thermal expansion thereof, and thus organic light-emitting film cannot be accurately and efficiently formed in pixel areas.

In one aspect, the present disclosure provides a method for manufacturing an organic light-emitting diode (OLED), comprising:

a step S10 of providing a substrate that includes a pixel area and a non-pixel area, wherein the pixel area includes a first pixel area, a second pixel area, and a third pixel area;

a step S20 of forming a first sacrificial layer in the first pixel area and the second pixel area, forming a third light-emitting material layer on the substrate, and removing the first sacrificial layer to expose the first pixel area and the second pixel area and to form a third pixel area organic layer;

a step S30 of forming a second sacrificial layer in the first pixel area and the third pixel area, forming a second light-emitting material layer on the substrate, and removing the second sacrificial layer to expose the first pixel area and the third pixel area and to form a second pixel area organic layer; and a step S40 of forming a third sacrificial layer in the second pixel area and the third pixel area, forming a first light-emitting material layer on the substrate, and removing the third sacrificial layer to expose the second pixel area and the third pixel area and to form a first pixel area organic layer;

wherein one of a vacuum evaporation technique, a physical vapor deposition technique, a chemical vapor deposition technique, and a pulsed laser deposition technique is used to form the first light-emitting material layer, the second light-emitting material layer, and the third light-emitting material layer.

In accordance with one embodiment of the present disclosure, the first pixel area, the second pixel area, or the third pixel area is one of blue pixel area, green pixel area, and red pixel area, and a color of the first pixel area, a color of the second pixel area, and a color of the third pixel area are different from each other.

In accordance with one embodiment of the present disclosure, a color of the first light-emitting material layer and the color of the first pixel area are same, a color of the second light-emitting material layer and the color of the second pixel area are same, and a color of the third light-emitting material layer and the color of the third pixel area are same.

In accordance with one embodiment of the present disclosure, the first sacrificial layer, the second sacrificial layer, and the third sacrificial layer are made of a binary fluoride.

In accordance with one embodiment of the present disclosure, an ink jet printing technique is used to form the first sacrificial layer, the second sacrificial layer, and the third sacrificial layer.

In accordance with one embodiment of the present disclosure, the step S20 comprises:

forming the first sacrificial layer in the first pixel area and the second pixel area using the ink jet printing technique;

forming the third light-emitting material layer on the substrate; and baking the substrate or performing a laser lift-off process on the substrate, so as to evaporate or sublimate the first sacrificial layer, and expose the first pixel area and the second pixel area.

In accordance with one embodiment of the present disclosure, the substrate is baked at a temperature lower than a decomposition temperature of the third light-emitting material layer and higher than a sublimation temperature of the first sacrificial layer.

In accordance with one embodiment of the present disclosure, in the step S10, the substrate includes a base plate and a pixel defining layer, the pixel defining layer includes a plurality of pixel defining bodies that are spaced apart from each other at an interval, a region confined by two adjacent pixel defining bodies is the pixel area, and a region in which the pixel defining bodies are disposed is the non-pixel area.

In an another aspect, the present disclosure provides an organic light-emitting diode (OLED) substrate, comprising:

a substrate including a pixel area and a non-pixel area, wherein the pixel area includes a first pixel area, a second pixel area, and a third pixel area;

a pixel defining layer disposed on the substrate, wherein the pixel defining layer includes a plurality of pixel defining bodies that define the first pixel area, the second pixel area, and the third pixel area, and a region to which the pixel defining bodies correspond is the non-pixel area; and a light-emitting layer including a first light-emitting material, a second light-emitting material, and a third light-emitting material;

wherein the non-pixel area is covered by the first light-emitting material, the second light-emitting material, and the third light-emitting material.

In a further aspect, the present disclosure provides a method for manufacturing an organic light-emitting diode (OLED) substrate, comprising steps of:

a step S10 of providing a substrate that includes a pixel area and a non-pixel area, wherein the pixel area includes a first pixel area, a second pixel area, and a third pixel area;

a step S20 of forming a first sacrificial layer in the first pixel area and the second pixel area, forming a third light-emitting material layer on the substrate, and removing the first sacrificial layer to expose the first pixel area and the second pixel area and to form a third pixel area organic layer;

a step S30 of forming a second sacrificial layer in the first pixel area and the third pixel area, forming a second light-emitting material layer on the substrate, and removing the second sacrificial layer to expose the first pixel area and the third pixel area and to form a second pixel area organic layer; and a step S40 of forming a third sacrificial layer in the second pixel area and the third pixel area, forming a first light-emitting material layer on the substrate, and removing the third sacrificial layer to expose the second pixel area and the third pixel area and to form a first pixel area organic layer.

In accordance with one embodiment of the present disclosure, the first pixel area, the second pixel area, or the third pixel area is one of a blue pixel area, a green pixel area, and a red pixel area, and a color of the first pixel area, a color of the second pixel area, and a color of the third pixel area are different from each other.

In accordance with one embodiment of the present disclosure, a color of the first light-emitting material layer and the color of the first pixel area are same, a color of the second light-emitting material layer and the color of the second pixel area are same, and a color of the third light-emitting material layer and the color of the third pixel area are same.

In accordance with one embodiment of the present disclosure, the first sacrificial layer, the second sacrificial layer, and the third sacrificial layer are made of a binary fluoride.

In accordance with one embodiment of the present disclosure, an ink jet printing technique is used to form the first sacrificial layer, the second sacrificial layer, and the third sacrificial layer.

In accordance with one embodiment of the present disclosure, the step S20 comprises:

forming the first sacrificial layer in the first pixel area and the second pixel area using the ink jet printing technique;

forming the third light-emitting material layer on the substrate; and baking the substrate or performing a laser lift-off process on the substrate, so as to evaporate or sublimate the first sacrificial layer, and expose the first pixel area and the second pixel area.

In accordance with one embodiment of the present disclosure, the substrate is baked at a temperature lower than a decomposition temperature of the third light-emitting material layer and higher than a sublimation temperature of the first sacrificial layer.

In accordance with one embodiment of the present disclosure, in the step S10, the substrate includes a base plate and a pixel defining layer, the pixel defining layer includes a plurality of pixel defining bodies that are spaced apart from each other at an interval, a region confined by two adjacent pixel defining bodies is the pixel area, and a region in which the pixel defining bodies are disposed is the non-pixel area.

The present disclosure provides an organic light-emitting diode (OLED) substrate and a method for manufacturing same. By forming three sacrificial layers, respectively, and then removing the three sacrificial layers, the light-emitting materials are sequentially formed in three different pixel areas. The subject invention solves the problems, where alignment between mask and substrate is not precise because mask itself will deform due to gravity and thermal expansion thereof, and thus organic light-emitting materials cannot be accurately and efficiently formed in pixel areas. Therefore, according to the subject invention, production yield of OLED substrates is increased.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
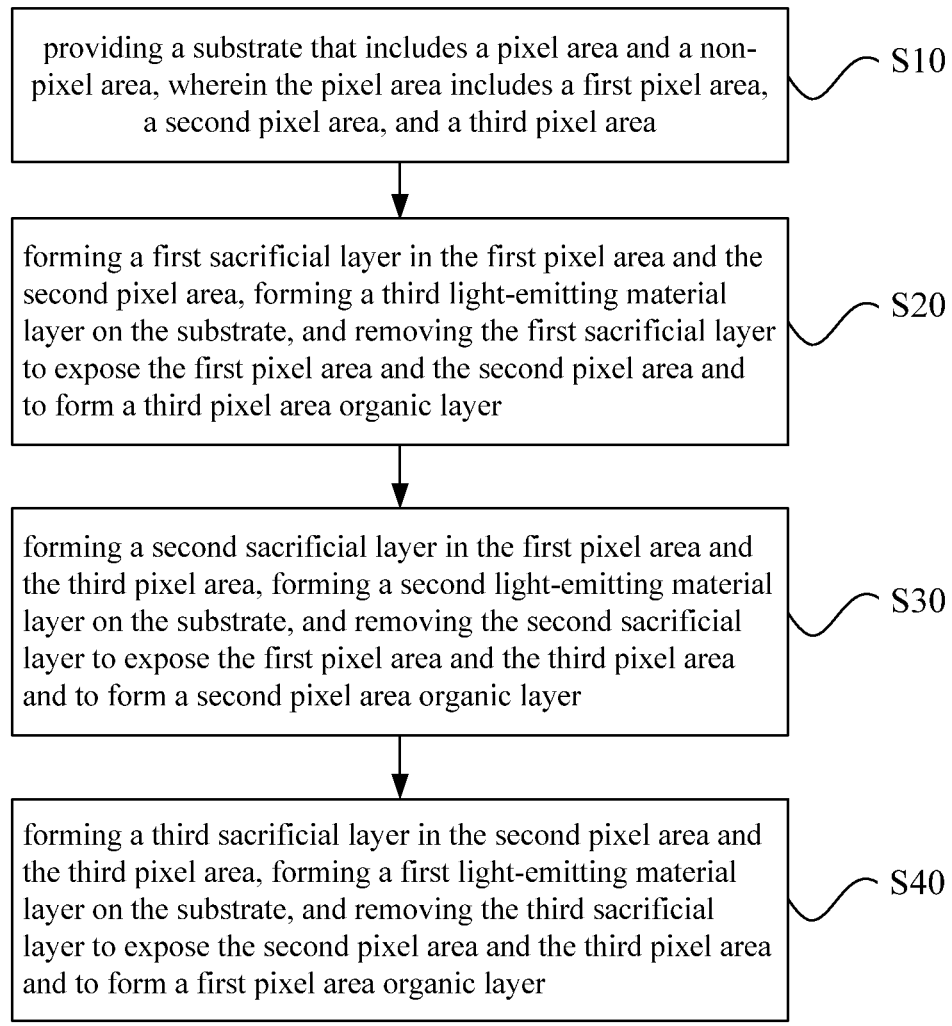
FIG. 1 shows a flowchart of a method for manufacturing an organic light-emitting diode (OLED) substrate according to one embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides an organic light-emitting diode (OLED) substrate and a method for manufacturing same to solve the problems encountered by the prior art, where alignment between mask and substrate is not precise because mask itself will deform due to gravity and thermal expansion thereof, and thus organic light-emitting film cannot be accurately and efficiently formed in pixel areas.

The following description for embodiments, in conjunction with drawings, is provided to facilitate understanding of the subject invention.

Please refer to FIG. 1. FIG. 1 shows a flowchart of a method for manufacturing an organic light-emitting diode (OLED) substrate according to one embodiment of the present disclosure.

The present disclosure provides a method for manufacturing an organic light-emitting diode (OLED) substrate.

Figure 2:
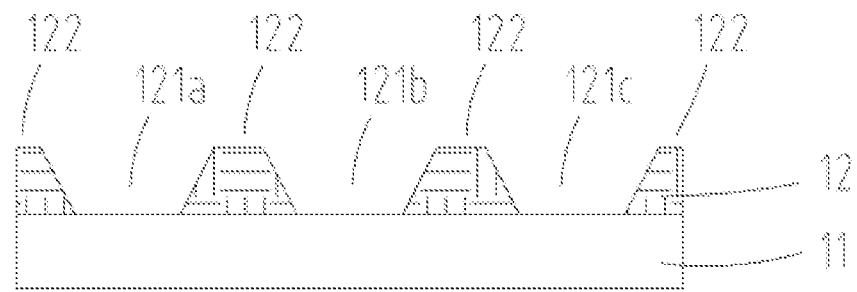
FIG. 2 shows a cross-sectional view of a structure of a substrate according to one embodiment of the present disclosure.

Please refer to FIG. 2. FIG. 2 shows a cross-sectional view of a structure of a substrate according to one embodiment of the present disclosure.

As shown in FIG. 2, in a step S10, a substrate 11 that includes a pixel area 121 and a non-pixel area 122 is provided, wherein the pixel area 121 includes a first pixel area 121a, a second pixel area 121b, and a third pixel area 121c.

In one embodiment of the present disclosure, the substrate 11 includes a pixel defining layer 12 formed thereon. The pixel defining layer 12 includes a plurality of pixel defining bodies that are spaced apart from each other at an interval. A region confined by two adjacent pixel defining bodies is the pixel area 121, and a region in which the pixel defining bodies are disposed is the non-pixel area 122.

In one embodiment of the present disclosure, the substrate 11 includes an array of thin film transistors (TFTs). The TFT array is configured to control turning-on and turning-off of pixel areas of the OLED display panel that includes the OLED substrate.

In one embodiment of the present disclosure, the first pixel area, the second pixel area, or the third pixel area is one of blue pixel area, green pixel area, and red pixel area. And, a color of the first pixel area, a color of the second pixel area, and a color of the third pixel area are different from each other.

In one embodiment of the present disclosure, the pixel areas of the subject invention are not limited to the three pixel areas. According to actual needs, the pixel areas could include four pixel areas. For example, if it is needed for the pixel areas to include blue pixel area, green pixel area, red pixel area, and white pixel area, only one additional step of forming a white pixel area organic layer is added. Formation of the white pixel area organic layer includes the same steps as that of forming organic layer in the blue pixel area, green pixel area, and red pixel area.

In one embodiment of the present disclosure, the step S10 further includes forming a common layer on the substrate 11. The common layer covers the pixel area 121 and the non-pixel area 122. The common layer functions to transport holes for the light-emitting excitons.

Figure 3A:
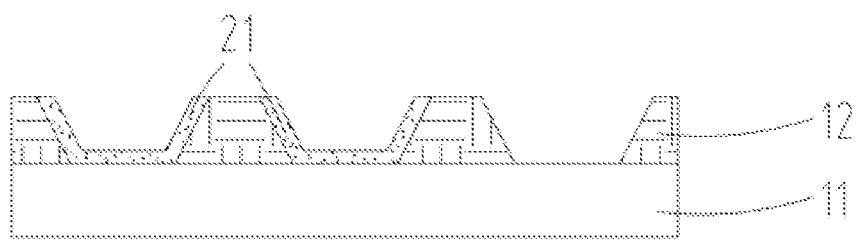
FIGS. 3A, 3B, 3C, and 3D are schematic diagrams showing different stages of a method for manufacturing an OLED substrate according to one embodiment of the present disclosure.
Figure 3B:
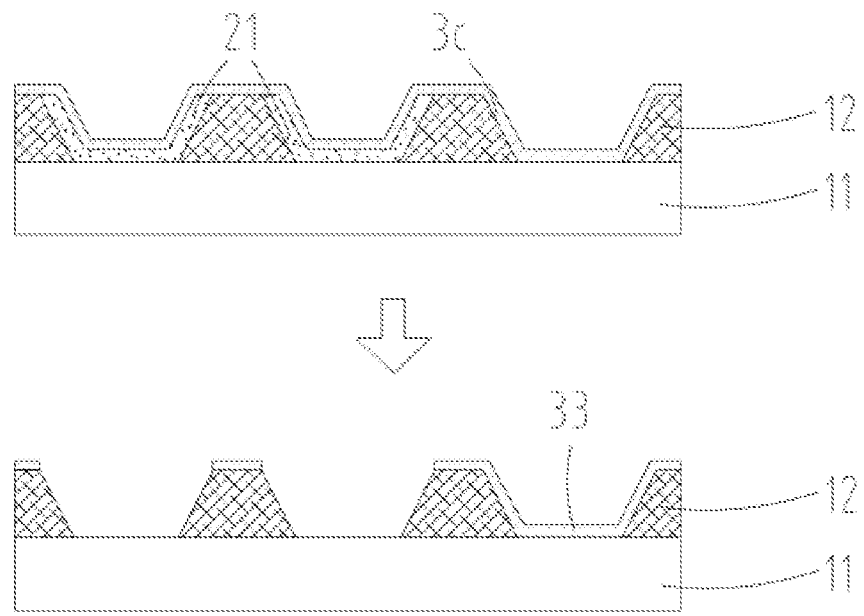

As shown in FIGS. 3A and 3B, in a step S20, a first sacrificial layer 21 is formed in the first pixel area 121a and the second pixel area 121b, a third light-emitting material layer 3c is formed on the substrate 11, and the first sacrificial layer 21 is removed to expose the first pixel area 121a and the second pixel area 121b and to form a third pixel area organic layer 33.

In one embodiment of the present disclosure, the first sacrificial layer 21 is formed in the first pixel area 121a and the second pixel area 121b using an ink jet printing technique. The third light-emitting material layer 3c is formed on the substrate 11. And, the substrate 11 is baked or a laser lift-off process is performed on the substrate 11, so as to evaporate or sublimate the first sacrificial layer 21, and expose the first pixel area 121a and the second pixel area 121b, such that the third pixel area organic layer 33 is formed.

Therefore, according to the present disclosure, the sacrificial layer is formed on the substrate first, and in a later step, the sacrificial layer is removed, such that the light-emitting material disposed on the sacrificial layer is removed while the organic layer 33 is remained. This avoids the problem that alignment between mask and substrate is not precise, thus increasing production yield of OLED substrates.

In one embodiment of the present disclosure, the first sacrificial layer 21 is made of a binary fluoride. Such materials is used because, according to the subject invention, the first sacrificial layer 21 should have the property that can be easily sublimated at normal pressure, and thus the material used to form the first sacrificial layer 21 has to have a low sublimation temperature and does not react with the light-emitting material. Since fluorine ions are inactive, and could combine with other elements, except for helium, neon, and argon, to form a binary fluoride, thus the sacrificial layer is made of a binary fluoride or other material that could be easily sublimated or lifted off at normal temperature. Similarly, the second sacrificial layer 22 and the third sacrificial layer 23 are made of binary fluoride or other material that could be easily sublimated or lifted off at normal temperature.

Herein, one of a vacuum evaporation technique, a physical vapor deposition technique, a chemical vapor deposition technique, and a pulsed laser deposition technique can be used to form the third light-emitting material layer 3c.

In one embodiment of the present disclosure, an open type mask is disposed on the substrate to evaporate the third light-emitting material layer 3c.

Figure 3C:
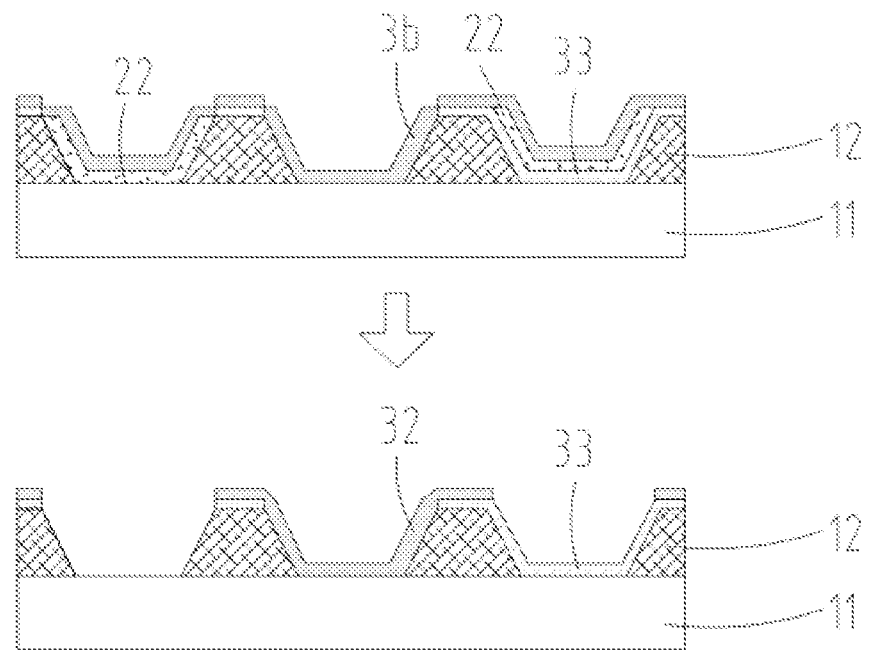

As shown in FIG. 3C, in a step S30, a second sacrificial layer 22 is formed in the first pixel area 121a and the third pixel area 121c, a second light-emitting material layer 3b is formed on the substrate 11, and the second sacrificial layer 22 is removed to expose the first pixel area 121a and the third pixel area 121c and to form a second pixel area organic layer 32.

Herein, the step S30 is similar to the step S20, and the step S30 is performed to form the second pixel area organic layer 32. Please refer to the step S20 to realize details thereof and understand the principle related to how the organic layer is formed.

Figure 3D:
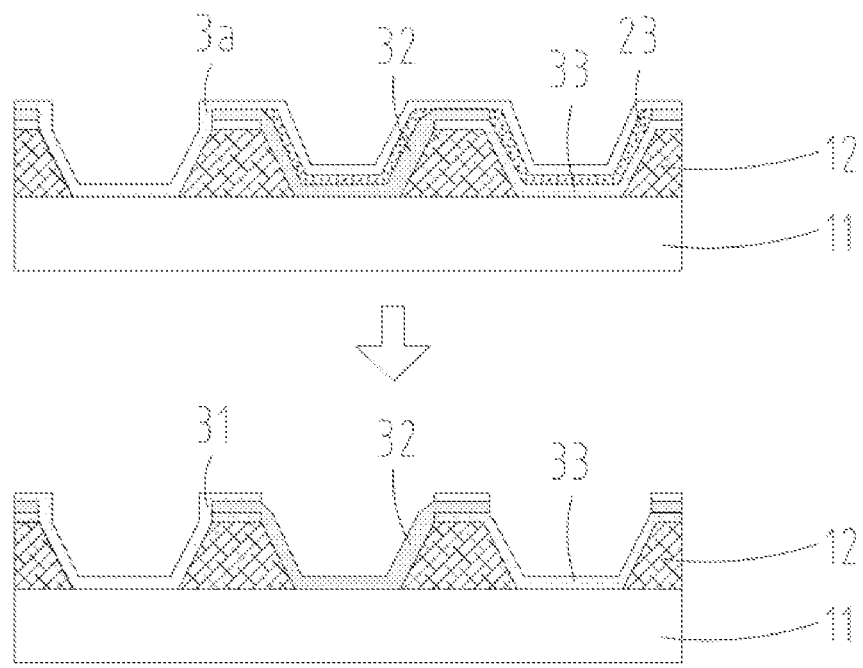

As shown in FIG. 3D, in a step S40, a third sacrificial layer 23 is formed in the second pixel area 121b and the third pixel area 121c, a first light-emitting material layer 3a is formed on the substrate 11, and the third sacrificial layer 23 is removed to expose the second pixel area 121b and the third pixel area 121c and to form a first pixel area organic layer 31.

Herein, the step S40 is similar to the step S20, and the step S40 is performed to form the first pixel area organic layer 31. Please refer to the step S20 to realize details thereof and understand the principle related to how the organic layer is formed.

In one embodiment of the present disclosure, a color of the first light-emitting material layer and the color of the first pixel area are same, a color of the second light-emitting material layer and the color of the second pixel area are same, and a color of the third light-emitting material layer and the color of the third pixel area are same.

In one embodiment of the present disclosure, an ink jet printing technique is used to form the first sacrificial layer, the second sacrificial layer, and the third sacrificial layer.

In one embodiment of the present disclosure, the substrate is baked at a temperature lower than a decomposition temperature of the light-emitting material layer and higher than a sublimation temperature of the sacrificial layer.

As shown in FIG. 3D, the non-pixel area 122 of the OLED substrate is covered by the first light-emitting material 31, the second light-emitting material 32, and the third light-emitting material 33. The first light-emitting material 31 is a blue light-emitting material, the second light-emitting material 32 is a green light-emitting material, and the third light-emitting material 33 is a red light-emitting material.

Please refer to FIG. 2. FIG. 2 shows a cross-sectional view of a structure of a substrate according to one embodiment of the present disclosure.

Figure 4:
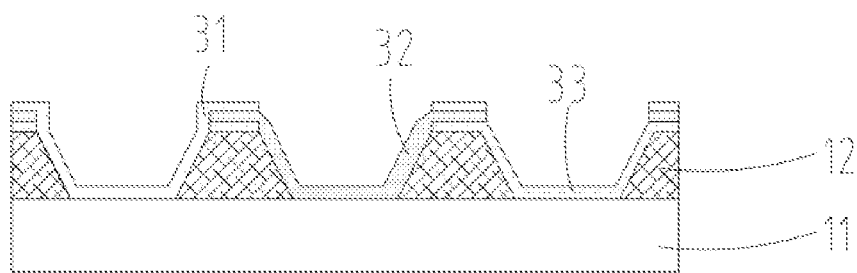
FIG. 4 shows a cross-sectional view of a structure of an OLED substrate according to one embodiment of the present disclosure.

Please refer to FIG. 4. FIG. 4 shows a cross-sectional view of a structure of an OLED substrate according to one embodiment of the present disclosure.

In an another aspect, the present disclosure further provides an organic light-emitting diode (OLED) substrate. The OLED substrate includes:

a substrate 11 including a pixel area 121 and a non-pixel area 122, wherein the pixel area 121 includes a first pixel area 121a, a second pixel area 121b, and a third pixel area 121c;

a pixel defining layer 12 disposed on the substrate 11, wherein the pixel defining layer 12 includes a plurality of pixel defining bodies that define the first pixel area 121a, the second pixel area 121b, and the third pixel area 121c, and a region to which the pixel defining bodies correspond is the non-pixel area 122; and a light-emitting layer including a first light-emitting material, a second light-emitting material, and a third light-emitting material;

wherein the non-pixel area is covered by the first light-emitting material, the second light-emitting material, and the third light-emitting material.

In one embodiment of the present disclosure, the non-pixel area 122 is an area where there is no light emitted therefrom.

The present disclosure provides an organic light-emitting diode (OLED) substrate and a method for manufacturing same. By forming three sacrificial layers, respectively, and then removing the three sacrificial layers, the light-emitting materials are sequentially formed in three different pixel areas. The subject invention solves the problems, where alignment between mask and substrate is not precise because mask itself will deform due to gravity and thermal expansion thereof, and thus organic light-emitting materials cannot be accurately and efficiently formed in pixel areas. Therefore, according to the subject invention, production yield of OLED substrates is increased.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an organic light-emitting diode (OLED) substrate, comprising steps of:
   a step S10 of providing a substrate that includes a pixel area and a non-pixel area, wherein the pixel area includes a first pixel area, a second pixel area, and a third pixel area;
   a step S20 of forming a first sacrificial layer in the first pixel area and the second pixel area, forming a third light-emitting material layer on the substrate, and removing the first sacrificial layer to expose the first pixel area and the second pixel area and to form a third pixel area organic layer;
   a step S30 of forming a second sacrificial layer in the first pixel area and the third pixel area, forming a second light-emitting material layer on the substrate, and removing the second sacrificial layer to expose the first pixel area and the third pixel area and to form a second pixel area organic layer; and
   a step S40 of forming a third sacrificial layer in the second pixel area and the third pixel area, forming a first light-emitting material layer on the substrate, and removing the third sacrificial layer to expose the second pixel area and the third pixel area and to form a first pixel area organic layer;

wherein one of a vacuum evaporation technique, a physical vapor deposition technique, a chemical vapor deposition technique, and a pulsed laser deposition technique is used to form the first light-emitting material layer, the second light-emitting material layer, and the third light-emitting material layer.

2. The method for manufacturing the OLED substrate according to claim 1, wherein the first pixel area, the second pixel area, or the third pixel area is one of blue pixel area, green pixel area, and red pixel area, and a color of the first pixel area, a color of the second pixel area, and a color of the third pixel area are different from each other.

3. The method for manufacturing the OLED substrate according to claim 2, wherein a color of the first light-emitting material layer and the color of the first pixel area are same, a color of the second light-emitting material layer and the color of the second pixel area are same, and a color of the third light-emitting material layer and the color of the third pixel area are same.

4. The method for manufacturing the OLED substrate according to claim 1, wherein the first sacrificial layer, the second sacrificial layer, and the third sacrificial layer are made of a binary fluoride.

5. The method for manufacturing the OLED substrate according to claim 4, wherein an ink jet printing technique is used to form the first sacrificial layer, the second sacrificial layer, and the third sacrificial layer.

6. The method for manufacturing the OLED substrate according to claim 5, wherein the step S20 comprises:
   forming the first sacrificial layer in the first pixel area and the second pixel area using the ink jet printing technique;
   forming the third light-emitting material layer on the substrate; and
   baking the substrate or performing a laser lift-off process on the substrate, so as to evaporate or sublimate the first sacrificial layer, and expose the first pixel area and the second pixel area.

7. The method for manufacturing the OLED substrate according to claim 6, wherein the substrate is baked at a temperature lower than a decomposition temperature of the third light-emitting material layer and higher than a sublimation temperature of the first sacrificial layer.

8. The method for manufacturing the OLED substrate according to claim 1, wherein in the step S10, the substrate includes a base plate and a pixel defining layer,
   the pixel defining layer includes a plurality of pixel defining bodies that are spaced apart from each other at an interval,
   a region confined by two adjacent pixel defining bodies is the pixel area, and
   a region in which the pixel defining bodies are disposed is the non-pixel area.

9. A method for manufacturing an organic light-emitting diode (OLED) substrate, comprising steps of:
   a step S10 of providing a substrate that includes a pixel area and a non-pixel area, wherein the pixel area includes a first pixel area, a second pixel area, and a third pixel area;
   a step S20 of forming a first sacrificial layer in the first pixel area and the second pixel area, forming a third light-emitting material layer on the substrate, and removing the first sacrificial layer to expose the first pixel area and the second pixel area and to form a third pixel area organic layer;
   a step S30 of forming a second sacrificial layer in the first pixel area and the third pixel area, forming a second light-emitting material layer on the substrate, and removing the second sacrificial layer to expose the first pixel area and the third pixel area and to form a second pixel area organic layer; and a step S40 of forming a third sacrificial layer in the second pixel area and the third pixel area, forming a first light-emitting material layer on the substrate, and removing the third sacrificial layer to expose the second pixel area and the third pixel area and to form a first pixel area organic layer.

10. The method for manufacturing the OLED substrate according to claim 9, wherein the first pixel area, the second pixel area, or the third pixel area is one of a blue pixel area, a green pixel area, and a red pixel area, and a color of the first pixel area, a color of the second pixel area, and a color of the third pixel area are different from each other.

11. The method for manufacturing the OLED substrate according to claim 10, wherein a color of the first light-emitting material layer and the color of the first pixel area are same, a color of the second light-emitting material layer and the color of the second pixel area are same, and a color of the third light-emitting material layer and the color of the third pixel area are same.

12. The method for manufacturing the OLED substrate according to claim 9, wherein the first sacrificial layer, the second sacrificial layer, and the third sacrificial layer are made of a binary fluoride.

13. The method for manufacturing the OLED substrate according to claim 12, wherein an ink jet printing technique is used to form the first sacrificial layer, the second sacrificial layer, and the third sacrificial layer.

14. The method for manufacturing the OLED substrate according to claim 13, wherein the step S20 comprises:
forming the first sacrificial layer in the first pixel area and the second pixel area using the ink jet printing technique;
forming the third light-emitting material layer on the substrate; and
baking the substrate or performing a laser lift-off process on the substrate, so as to evaporate or sublimate the first sacrificial layer, and expose the first pixel area and the second pixel area.

15. The method for manufacturing the OLED substrate according to claim 14, wherein the substrate is baked at a temperature lower than a decomposition temperature of the third light-emitting material layer and higher than a sublimation temperature of the first sacrificial layer.

16. The method for manufacturing the OLED substrate according to claim 9, wherein in the step S10, the substrate includes a base plate and a pixel defining layer,
the pixel defining layer includes a plurality of pixel defining bodies that are spaced apart from each other at an interval,
a region confined by two adjacent pixel defining bodies is the pixel area, and
a region in which the pixel defining bodies are disposed is the non-pixel area.

* * * * *